United States Patent [19]

Clark

[11] 4,350,837

[45] Sep. 21, 1982

[54] SPECTROVOLTAIC SOLAR ENERGY CONVERSION SYSTEM

[76] Inventor: Stephan R. Clark, 13811 Crested Pt., San Antonio, Tex. 78217

[21] Appl. No.: 233,465

[22] Filed: Feb. 11, 1981

[51] Int. Cl.³ .............................................. H01C 31/04
[52] U.S. Cl. ................................................... 136/246
[58] Field of Search .......................... 136/246; 353/3; 250/203 R

[56] References Cited

U.S. PATENT DOCUMENTS 4,021,267 5/1977 Dettling ............................... 136/246
4,204,881 5/1980 McGrew ............................. 136/246

Primary Examiner—Aaron Weisstuch

[57] ABSTRACT

A spectrovoltaic energy conversion system is disclosed having a refracting and wavelength dispersing medium variably placed in the path of photons of parallel rays directed from a concentrating and focusing device, causing selective spectral dispersion of said photons onto a photovoltaic cell array.

9 Claims, 7 Drawing Figures

SPECTROVOLTAIC SOLAR ENERGY CONVERSION SYSTEM

SUMMARY OF THE INVENTION

The present invention relates generally to a method and apparatus for constructing a spectrovoltaic solar energy conversion system. The classification of the invention as a spectrovoltaic converter is intended to specify a hybrid variation of the photovoltaic principle whereby only photons of a select threshold wavelength and range of wavelengths are concentrated by an analog device onto a photovoltaic cell array.

The spectrovoltaic converter is constructed by placement of a refracting and dispersing medium in the path of photons directed from a concentrating and focusing device, hereinafter referred to as a photon flux compression device, onto a photovoltaic cell array of defined band gap. The invention incorporates the intended ability to automatically adjust the distance and attitude of the refracting and dispersing medium relative to the photovoltaic material.

A most significant limitation to the economic operation of photovoltaic cells is the inability to concentrate the intensity of the incident radiation without incurring counterproductive loss processes associated with overheating of the cell. A notable but not exclusive loss process is the decrease in the junction resistance to leakage and the resultant increase in current leaked across the p-n junction. This significantly decreases the maximum voltage possible across the photovoltaic cell and accordingly, the power output is thus greatly reduced.

The photovoltaic effect is a well defined process and can be generally described as a process whereby photons of energy equal to or greater than the band gap, defined by the particular photovoltaic material used, photolytically generate electron and hole pairs. Energy of an incident photon is a function of the frequency of the incident radiation. A shorter wavelength results in greater energy per photon. The energy of a photon in excess of the band gap goes into other processes which heat the photovoltaic material and does not contribute to increased pair production. The excessive heating of the cell occurs when photon energy in excess of the threshold band gap is absorbed within the cell. Accordingly, indiscriminate radiation of photovoltaic materials by light of diverse spectral composition, as in the case of solar radiation, will excessively heat the photovoltaic material when wavelengths of higher energy are absorbed. Although the increase in energy per photon as frequency increases in a linear function, the ratio of "heat energy" to "pair productive energy" decreases asymptotically as the incident radiation is increasingly restricted to photons of energy just sufficient for pair production. A tradeoff results with the use of indiscriminate radiation where power could be increased by increasing the intensity (number of photons) by concentrators, but the temperature dependence of the photovoltaic material limits the factor of concentration which can be employed.

The loss processes are typified in the case of silicon cells of defined band gap of 1.1 eV. The wavelength below which absorption occurs is approximately 1122 nm. Roughly eighty percent of the solar spectrum at sea level is less than or equal 1122 nm and thus can be absorbed. However, much of this energy is far greater than the threshold band gap. Therefore, the excess energy goes to thermal processes rather than the photolytic production of electron-hole pairs. In the case of photons of wavelength of 374 nm, three times the energy necessary is absorbed. The state of the art now permits an optimal concentration factor of approximately three for silicon cells without engineered cooling.

The conventional approach to this problem is to follow one or a combination of three alternatives summarized below.

1—accept a limitation of the concentration factor attainable and attempt to further decrease the cost of cell production.

2—devise a method for heat transfer away from the cell by engineered means of cell cooling such as refrigeration, convection, or conduction.

3—investigate photovoltaic material of higher band gap.

New cell growth techniques have reduced costs considerably, but costs remain several orders of magnitude too high for economic application without significant concentration factors. Although cooling procedures have increased cell output under low concentration factors, a tradeoff is quickly reached between energy spent for cooling and photovoltaic power output. Photovoltaic cells of higher band gap do afford a higher initial voltage, but the negative slope of temperature dependence is the same as with silicon, and these materials are several times more expensive than silicon.

The present invention radically departs in principle, as well as method and apparatus, from the conventional approach. The invention described herein selectively restricts, by means of refraction and dispersion, the range of wavelengths that is transmitted to the photovoltaic cell. As energy of longer wavelength has relatively less refrangibility, the spectrum is thus separated in descending wavelength, so that by varying the distance and attitude of the refracting medium to the cell, an increasingly greater amount of energy of relatively shorter wavelength can be refracted away from the cell.

The present invention is constructed to restrict the irradiance of the photovoltaic material to photons having wavelengths associated with the threshold band gap. The invention can be used with any photovoltaic material of defineable band gap. The spectroscopy results in a reduction of the total number of photons available from normal intensity solar radiation. However, due to the greater rate of reduction of thermal processes, concentration can be increased to more than offset the loss of photons of shorter wavelength. The resultant increased economy of spectrovoltaic over photovoltaic power production is several orders of magnitude. This is due to the ability to substitute low cost concentrators in place of high cost photovoltaic material.

Conventional solar concentrators focus radiation by convergence, be it with reflector or lens. This does not provide parallel light ray incidence to the photovoltaic material. The spectroscopy inherent with the present invention requires parallel photon flux compression for well resolved wavelength dispersion. The term compression is used intentionally to distinguish parallel ray propagation from converging concentration. This flux compression is achieved by the present invention by placement of two concentrators of sequentially decreasing latera recta around a shared or common focus. This can be achieved by lens or mirror through refraction or reflection.

Another drawback to photovoltaic energy conversion systems is the inability to variably offset the loss of optimum solar irradiance due to daily, seasonal, or atmospheric variations in irradiance intensity. The conventional systems design provides concentrators to accomodate maximum intensity. To vary from this principle would result in underutilization of concentration capacity or cause cell deterioration by exposure to destructive levels of radiation, the result being that the average radiation is far less than the cyclic maximum which could be experienced and thus the photovoltaic cells are underutilized. The present invention employs a variable prism as its wavelength dispersing medium. The prism is incorporated as an analog device with two methods of varying the intensity of solar irradiance striking the photovoltaic material. As solar irradiance decreases due to cloud cover, cyclic, or other irradiance reduction process, the prism can either rotate its orientation or reduce its distance to the photovoltaic material. This has the effect of increasing the range of wavelengths that strike the cell. This is an automatic process directed by a photocell sensor or thermostat in concert with a calibrating calculator and motor unit. A multiple axis tracking mechanism is incorporated for constant orientation of the parabolic trough to the sun.

BRIEF DESCRIPTION OF THE DRAWINGS

Other objects and advantages of the invention will become apparent upon a careful reading of the following detailed description of the invention, the claims and the drawings, in which like reference characters are used throughout to denote like parts in several views, wherein:

While the invention will be described in connection with a preferred embodiment, it will be understood that it is not intended to limit the invention to that embodiment. On the contrary, it is intended to cover all alternatives, modifications and equivalents as may be included in the spirit and scope of the invention as defined by the appended claims.

DETAILED DESCRIPTION OF THE DRAWINGS

Figure 1:
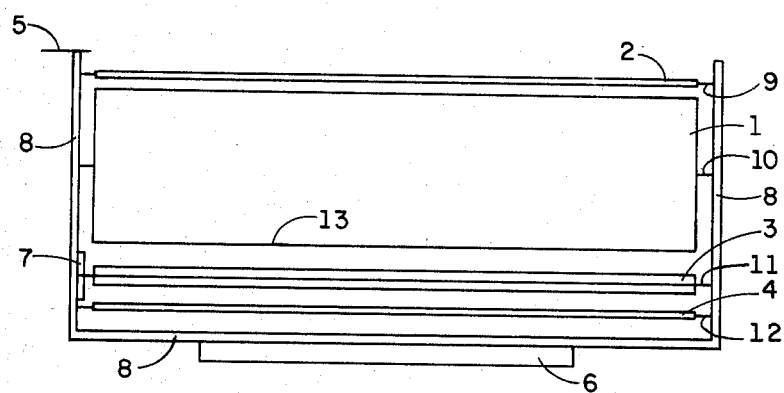
FIG. 1 is a vertical lengthwise side view of the preferred embodiment incorporating the complementary relationships of the components labeled as follows:
1—converging concentrator (parabolic trough)
2—focusing reflector for parallel ray propagation
3—prism
4—photovoltaic cell array
5—photocell intensity sensor
6—multi-axis tracking mechanism attachment
7—calibration calculator, thermostat, and motor unit housing
8—support arms and base
9—focusing reflector axis
10—converging concentrator axis
11—prism axis
12—photovoltaic material axis
13—horizontal slit in concentrator

Referring now to the drawings, and more specificly to FIG. 1, a spectrovoltaic energy conversion system is shown incorporating a parabolic trough reflecting concentrator 1, a parabolic trough focusing reflector 2, a glass prism 3, and a photovoltaic cell array 4.

Figure 2:
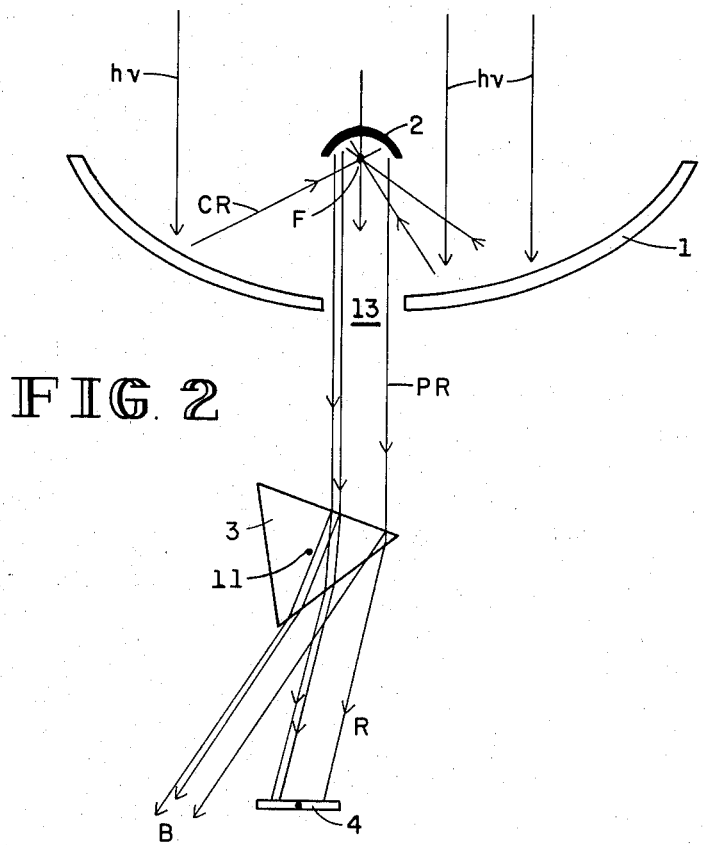
FIG. 2 is a vertical cross-sectional view showing the concentrator 1, reflector 2, prism 3, and photovoltaic material 4. Incident solar radiation hv is shown striking concentrator 1, reflecting in convergent rays CR, passing through common focus F, striking reflector 2, propagating in parallel rays PR, through slit 13, refracting through interfaces of prism 3, and dispersing in two discrete wavelengths, R and B, of which wavelength R strikes the photovoltaic material 4.

FIG. 2 shows the vertical orientation of the four major components described above. A horizontal slit 13, runs the length of the concentrator 1, and is equal in width to the latus rectum of the reflector 2, which is equal to four times the length of the vertex to the focus of reflector 2. The prism is equal in length to the length of the concentrator. The width of the prism interfaces is shown to be twice the width of the horizontal slit. However, the preferred width and angle between the interfaces is dependent on the refractive index of the transmissive medium employed by the prism, as well as the range of wavelengths preferred and distance to the photovoltaic cells. The rotational axis is depicted as equidistant from the three interfaces of the prism. However, it is noted that the strategic location of the axis, and the width of the prism interfaces, is dependent among other things, on the band gap, concentration factor, and distance of the prism to the photovoltaic cells.

For the sake of clarity, FIG. 2 shows only two discrete wavelengths R and B, although it is acknowledged that the spectrum is effectively continuous. The rays striking the concentrator 1, are depicted as parallel although the distance to the sun and atmospheric effects on parallelism are acknowleged.

The preferred embodiment extends the mirrored concave surfaces of both the concentrator 1 and the reflector 2, to the latus rectum of each. The invention utilizes a highly reflective polished concave mirror for the concentrator 1 and a one-way mirror for the reflector 2 which would reflect rays incident to its concave surface and transmit rays through its convex surface. Lenses could achieve similar results by refraction in lieu of reflectors.

Figure 3:
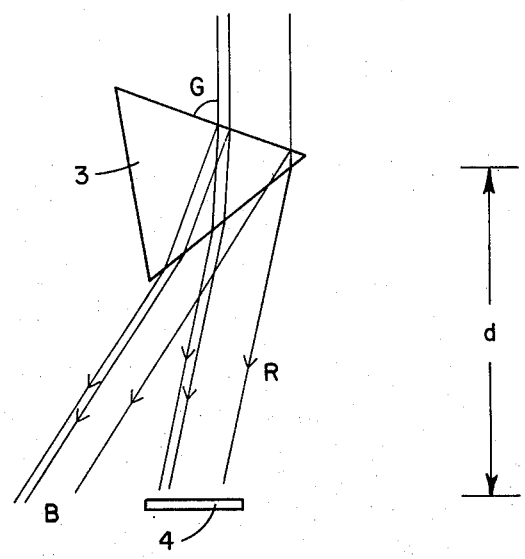
FIG. 3 is a partial cross-sectional view as in FIG. 2, showing in detail the dispersion of two selected wavelengths of 450 nm (blue) B, and 650 nm (red) R. The angle of deflection from path of parallel rays by wavelength B is greater than the angle of deflection for wavelength R. Wavelength R is depicted impinging on photovoltaic material 4, while wavelength B is shown dispersed away from photovoltaic material. The angle of incidence G, is shown between the parallel rays PR and the prism 3.

The photovoltaic cell array is shown at a 90 degree angle to the parallel rays. It is again acknowledged that depending on the factors affecting prism location, the attitude of the photovoltaic cell array will vary somewhat from 90 degrees so as to insure a perpendicular attitude to the dispersed ray associated with the longest desired wavelength. The width (W) of the active photovoltaic material is defined by:

$$W = h + \cos(a-b)/r$$

where,
- h = width of horizontal slit in concentrator
- a = angle of dispersion from path of parallel ray associated with shortest desired wavelength
- b = angle of dispersion from path of parallel ray associated with longest desired wavelength
- r = distance to photovoltaic material along dispersed ray of shortest desired wavelength when photovoltaic material is placed perpendicular to the dispersed ray of longest desired wavelength FIG. 3 is a partial cross-sectional view showing in detail the dispersion of the aforementioned two discrete wavelengths. They are labeled for discussion as B representing a wavelength of 450 nm and a color of blue, and R representing a wavelength of 650 nm and a color of red. Although FIG. 3 depicts exclusive absorption of the discrete wavelength R, it is understood that a degree of overlapping of wavelengths will occur. This overlap is to be minimized by reducing the width of the horizontal slit consistent with a reduction in the latus rectum of reflector 2. The preferred width therefore will be a function of the cost of optical precision in manufacture as well as other factors mentioned above.

Figure 4:
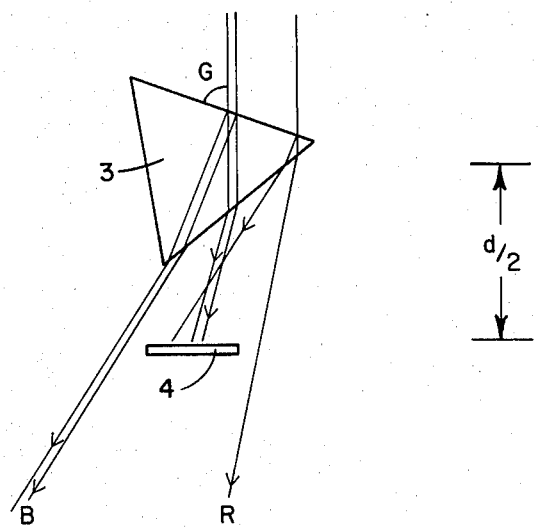
FIG. 4 is the same cross-sectional view as in FIG. 3 except that the distance between prism 3 and the photovoltaic material has been decreased.

FIG. 4 shows the same view as FIG. 3 except that the distance between the prism and the photovoltaic cell array has been reduced to one half its original distance in FIG. 3. Note that the effect of this movement is to shift and concentrate the spectral range striking the photovoltaic cell array. Some of the photons of wavelength B are now shown as striking the surface of the photovoltaic cell array. Some of the photons of wavelength R are now missing the P-V cell.

Figure 5:
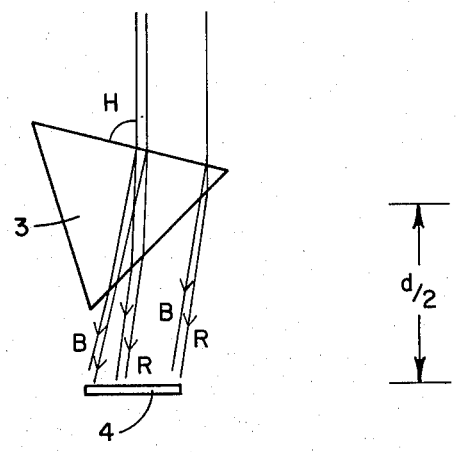
FIG. 5 is again the same partial cross-sectional view as in FIG. 4 except that the prism has been partially rotated so that the angle of incidence H, has varied from angle G in FIG. 4.

FIG. 5 depicts a partial rotation of the prism from the condition in FIG. 4. The effect of this rotation is to further shift and concentrate the spectral range striking the photovoltaic surface by reduction in the differences between the angles of dispersion.

The preferred embodiment of the invention incorporates a glass prism to vary the spectral range incident to the photovoltaic cell array by the two movements depicted in FIG. IV and FIG. V. It is acknowledged that movement and rotation of the other components relative to the prism can achieve similar results.

In order to minimize discussion non-essential to the nexus of the claims, the drawings have intentionally omitted details as to the placement and location of electrical wiring, the leads, the multi-axis tracking mechanism, as well as the operational components of the spectral intensity calculator, thermostat, and motor unit, as ancillary, self explanatory, common knowledge, or commercially available.

The preferred embodiment incorporates the use of a silicon cell as particularly attractive due to its cost, availability, and well defined operating characteristics. Important to the spectrovoltaic principle is the photon flux density available at or near the band gap threshold. Silicon is again particularly well suited. In addition, being of relatively low band gap, the potential for intensity moderation by movement of the prism is accordingly enhanced.

The principle behind the ability to achieve greater power output by use of this invention over conventional photovoltaics is presented in the foregoing summary of the invention. The theoretical increase in performance per photovoltaic cell, defined as the factor increase in photolytic generation potential(PGP), can be estimated from the drawing FIG. 6, where:
- x = wavelength associated with the threshold band gap of the P-V cell
- x' = wavelength below which photons are dispersed away from the P-V cell
- y = eV of the band gap
- y' = eV associated with photons of wavelength x'

The increased concentration factor possible due to less thermal excitation processes can be expressed as $F_c$, where:

$$F_c = \frac{(2.5 - y)(x - 500)}{(x - x')(y' - y)}$$

Figure 6:
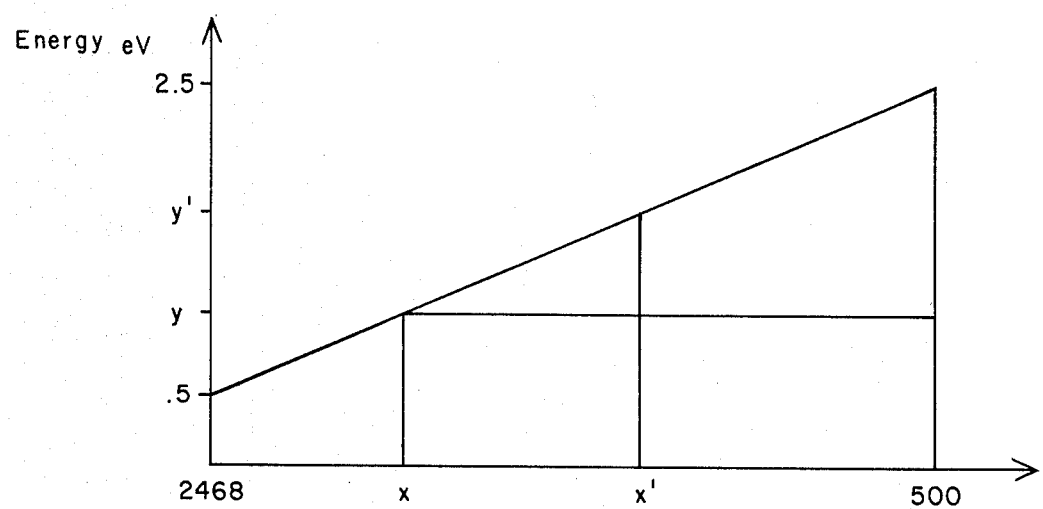
FIGS. 6 and 7 are graphs used in understanding the theoretical basis of the invention.

The above relation and drawing FIG. 6 make reference to a prescribed range of wavelengths (x through x') that will permit an added concentration factor of $F_c$, without increasing the amount of excess energy associated heating and loss processes.

In order to present a concise discussion of the principles and relationships involved, drawing FIG. 6 and the above relation for $F_c$ expressed x and x' in nano-meters. However, this results in a non-arithmetic scale for the abscissa. To facilitate a quantitative solution, the prescribed range of wavelengths (x-x') could be expressed in frequency, f, in Hz, rather than wavelength, λ, in nano-meters. This conversion is common practice and is given by the relation $\lambda = c/f$, where c is the velocity of light. This conversion from wavelength to frequency enables the use of an arithmetic abscissa and defines the slope of the line (y to y') to be Planck's constant, h, or roughly $6.625 \times 10^{-27}$ erg-sec.

The prescribed range of wavelengths (x through x') can be defined quantitatively using the above relation for $F_c$.

To solve for x', assign the following values:
- x = wavelength associated with the threshold band gap of the P-V cell
- y = eV of the band gap
- Set $y' = hc/x'$
- Solve for x'.

The preferred embodiment uses a calibration calculator to continuously adjust the prism and thus vary the optimum range of wavelengths by recalculating x' as the irradiance intensity varies due to daily, seasonal, or atmospheric variations as discussed previously.

As an example of the ongoing recalculations, let $F_c$ at peak irradiance intensity be given the value of 7, i.e., a concentration factor of seven. At one-half solar intensity, due to cloud cover or other reason, $F_c$ becomes 7·½ or 3.5, and x' is then recalculated by the calibration calculator using the new value for $F_c$. The prism is moved, the range of wavelengths is now expanded to a new value of x', and the constant optimal temperature of the P-V cell is maintained.

The variance in solar intensity is measured directly by irradiance of the spectral intensity photocell sensor or indirectly by thermostat reading the temperature of the P-V material. This value for solar intensity is then inputted to the calibration calculator. The calibration calculator directs the movement of the prism axis as previously described and as shown in drawing FIGS. 3–5.

This automatic process insures that under less than maximum solar irradiance, productive photons are not needlessly dispersed away from the P-V cell.

The factor of productive photons lost due to dispersion can be expressed as $F_1$, where:

$$F_1 = (x - x')/(x - 500)$$

Therefore, the increase in performance of a spectrovoltaic cell can be estimated by the multiplier P:

$$P = F_c \cdot F_1$$

or, $P = (2.5 - y)/(y' - y)$

The foregoing multiplier P, significantly underestimates the factor increase in performance as it excludes consideration of approximately ten percent of all incident photons that have energy in excess of 2.47 eV. Although a more precise estimate can be obtained, limiting the purview of this discussion to a finite range of wavelengths (wherein a fairly constant photon density is experienced), greatly enhances a description of the principle involved.

Figure 7:
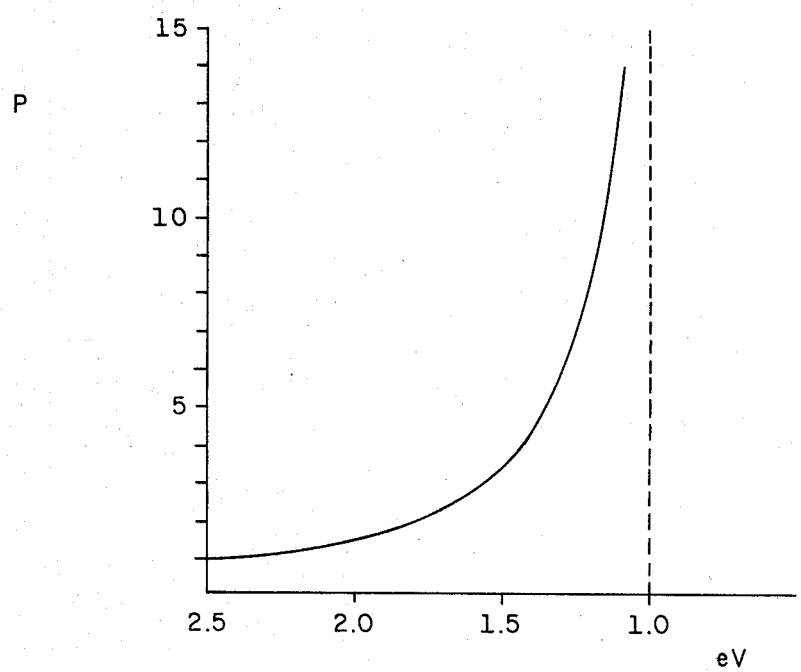

The following drawing FIG. 7 demonstrates the asymptotic increases in performance. The multiplier P, is the factor increase in the number of photons of sufficient energy for pair production that can be directed to the photovoltaic cell without increasing the temperature of the cell. The drawing FIG. 7 for silicon of band gap of band gap 1.1, shows the resultant increase in performance as the maximum incident energy per photon is restricted by spectral selection. There would appear to be no limit to the increaase possible. However, constraints are obviously present in regards to approaching the optical precision required for an infinitely small spectral range. The inherent characteristics of the photovoltaic material such as purity, density, mobility, etc., will provide additional limits.

From the foregoing it will be seen that this invention is one well adapted to attain all of the ends and objects hereinabove set forth, together with the other advantages which are obvious and which are inherent to the apparatus.

It will be understood that certain features and subcombinations are of utility and may be employed with reference to other features and subcombinations. This is contemplated by and is within the scope of the claims.

As many possible embodiments may be made of the invention without departing from the scope thereof, it is understood that all matter herein set forth or shown in the accompanying drawings is to be interpreted as illustrative and not in a limiting sense.

The invention having been described, what is claimed is:

1. A method of constructing a spectrovoltaic solar energy conversion system comprising:
   (a) providing a parabolic trough concentrator of reflective concave surface with a horizontal slit centered at the vertex and mirrored surface extending no further than the latus rectum;
   (b) providing a second parabolic trough one-way reflector of shorter latus rectum than concentrator in step (a), with mirrored concave surface and transmissive convex surface extending to latus rectum.
   (c) providing a glass prism or refracting medium of non-parallel interface equal in length to the parabolic troughs in steps (a) and (b), and sufficient in width for effective spectral dispersion.
   (d) providing a photovoltaic array of linear grid orientation, equal in length to the concentrator, reflector, and prism in steps (a), (b), and (c), respectively, and of sufficient width to receive dispersed incident radiation of selected range of wavelengths directed from prism in step (c);
   (e) providing a horizontal axis for parallel attachment of concentrator, reflector, prism, and photovoltaic cells to a supporting structure.
   (f) providing a motor unit, thermostat, calibration calculator, and housing;
   (g) providing a spectral intensity photocell sensor;
   (h) providing support arms and base for fixed attachment of concentrator, reflector, photovoltaic cell array, multi-axis tracking mechanism; and for variable attachment of prism axis and housing for motor unit, thermostat, and calibration calculator;
   (i) securing in a parallel orientation the concentrator, and reflector so that the concentrator and reflector share a common line of focal points, the latera recta of both share a common line, and the distance between their vertices is equal to the sum of the distances from each vertex to the respective latus rectum;
   (j) securing the prism beneath the horizontal slit of the concentrator by securing the prism axis to the motor unit and support arms so as to allow vertical and rotational movement of the prism axis relative to the fixed orientations of the concentrator, reflector, and photovoltaic cell array.

2. The method of claim 1, including providing a converging concentrator whose latus rectum is greater than the latus rectum of the reflector by a factor no less than $$\frac{(2.5 - y)(X - 500)}{(x - x')(y' - y)}$$

where, x is equal to the wavelength associated with the threshold band gap of the photovoltaic material, x' is equal to the wavelength below which photons are dispersed away from the photovoltaic material, y is equal to the threshold energy level of the band gap, and y' is equal to the energy associated with photons of wavelength x'; where x and x' are expressed in nano meters and y and y' are expressed in electron volts.

3. The method of claim 1, including the providing of a photovoltaic material of length equal to the length of the concentrator and whose width is equal to the width of the horizontal slit plus the cosine of, the angle of dispersion from path of parallel rays associated with the shortest desired wavelength minus the angle of dispersion for the wavelength of longest desired wavelength, divided by the distance to the photovoltaic material along the dispersed ray of shortest desired wavelength when the photovoltaic material is placed perpendicular to the dispersed ray of the longest desired wavelength.

4. A spectrovoltaic solar energy conversion system constructed by:
   (a) securing in a parallel orientation a parabolic trough concentrator and parabolic trough reflector so that the concentrator and reflector share a common line of focal points, the latera recta of which are unequal and share a common line, the distance between the two vertices is equal to the sum of the distances from each vertex to its respective latus rectum, and the mirrored surfaces extend no further than the latera recta;

(b) securing a prism beneath the horizontal slit of the concentrator by attaching the prism axis to a motor unit and support arms so as to allow vertical and rotational movement of the prism axis relative to the fixed orientations of the concentrator, reflector, and photovoltaic cell array;

(c) securing the photovoltaic cell array in a parallel orientation at an angle below the prism;

(d) orienting the concentrator, by multi-axis solar tracking device, so that solar radiation can be concentrated and focused in parallel rays, through a wavelength dispersing medium and selectively directed to and absorbed by a photovoltaic cell array.

5. The device as set forth in claim 4, including a spectral intensity photocell sensor, thermostat, motor unit, calibration calculator, housing, and multi-axis solar tracking mechanism.

6. The device as set forth in claim 5, wherein light rays concentrated by convergence are reflected or refracted in parallel with a greater photon flux density by means of a lens or mirror the angle of refraction or reflection of which complements the convergence of the concentrator in order to produce parallel rays.

7. The device as set forth in claim 6, wherein the prism can be moved in vertical or rotational fashion by motor unit as directed by calibration calculator in concert with thermostat and spectral intensity photocell sensor, so as to refract and disperse incident to the photovoltaic material, photons associated with the complete solar spectrum or refract and disperse away from the photovoltaic cell array all photons of wavelengths greater than or less than a prescribed range of wavelengths, determined as optimal by the calibration calculator.

8. The device as set forth in claim 7, wherein irradiance intensity incident to the photovoltaic cell can be increased by relative movement of the prism during non-peak periods of solar radiation intensity by means of a prism axis that can vary its orientation or its distance to the photovoltaic material.

9. A spectrovoltaic energy conversion system comprising a refracting and wavelength dispersing medium variably placed in the path of photons directed from a concentrating or focusing device causing selective spectral dispersion of said photons onto a photovoltaic cell array whereby said variable placement will be achieved by a relative change in the attitude and/or distance of the refracting medium to the photovoltaic material to insure maximum power from the temperature dependent photovoltaic material by maintaining an optimal temperature and optimal number and mix of photons under varying levels of irradiance intensity.

* * * * *